(12) United States Patent
Chan et al.

(10) Patent No.: US 8,513,107 B2
(45) Date of Patent: Aug. 20, 2013

(54) REPLACEMENT GATE FINFET DEVICES AND METHODS FOR FORMING THE SAME

(75) Inventors: Bor-Wen Chan, Hsin-Chu (TW); Fang Wen Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 267 days.

(21) Appl. No.: 12/693,504

(22) Filed: Jan. 26, 2010

(65) Prior Publication Data

US 2011/0183508 A1 Jul. 28, 2011

(51) Int. Cl.
*H01L 21/3205* (2006.01)
*H01L 21/4763* (2006.01)

(52) U.S. Cl.
USPC ........... 438/591; 438/164; 438/283; 438/479; 257/E21.19; 257/E21.421; 257/E29.264

(58) Field of Classification Search
USPC . 438/149, 157, 283, 589, 591; 257/E29.137, 257/E29.159, E21.444, E21.202
See application file for complete search history.

(56) References Cited

U.S. PATENT DOCUMENTS

| 6,706,571 | B1 | 3/2004 | Yu et al. | |
|---|---|---|---|---|
| 6,858,478 | B2 | 2/2005 | Chau et al. | |
| 6,921,711 | B2 | 7/2005 | Cabral, Jr. et al. | |
| 7,190,050 | B2 | 3/2007 | King et al. | |
| 7,247,887 | B2 | 7/2007 | King et al. | |
| 7,265,008 | B2 | 9/2007 | King et al. | |
| 7,508,031 | B2 | 3/2009 | Liu et al. | |
| 7,528,465 | B2 | 5/2009 | King et al. | |
| 7,531,437 | B2 * | 5/2009 | Brask et al. | 438/585 |
| 7,605,449 | B2 | 10/2009 | Liu et al. | |
| 2002/0192952 | A1 * | 12/2002 | Itoh et al. | 438/656 |
| 2005/0153490 | A1 | 7/2005 | Yoon et al. | |
| 2007/0120156 | A1 | 5/2007 | Liu et al. | |
| 2007/0122953 | A1 | 5/2007 | Liu et al. | |
| 2007/0122954 | A1 | 5/2007 | Liu et al. | |
| 2007/0128782 | A1 | 6/2007 | Liu et al. | |
| 2007/0132053 | A1 | 6/2007 | King et al. | |
| 2008/0050897 | A1 * | 2/2008 | Kottantharayil | 438/513 |
| 2008/0122101 | A1 * | 5/2008 | Oku et al. | 257/762 |
| 2008/0124919 | A1 * | 5/2008 | Huang et al. | 438/643 |
| 2008/0174021 | A1 * | 7/2008 | Choi et al. | 257/751 |
| 2008/0290470 | A1 | 11/2008 | King et al. | |
| 2008/0296632 | A1 | 12/2008 | Moroz et al. | |
| 2009/0181477 | A1 | 7/2009 | King et al. | |
| 2010/0052079 | A1 * | 3/2010 | Hirano et al. | 257/412 |
| 2011/0084340 | A1 * | 4/2011 | Yuan et al. | 257/368 |
| 2011/0147812 | A1 * | 6/2011 | Steigerwald et al. | 257/288 |

* cited by examiner

*Primary Examiner* — Charles Garber
*Assistant Examiner* — Abdulfattah Mustapha
(74) *Attorney, Agent, or Firm* — Duane Morris LLP

(57) ABSTRACT

A structure and method for replacement metal gate technology is provided for use in conjunction with semiconductor fins or other devices. An opening is formed in a dielectric by removing a sacrificial gate material such as polysilicon. The surfaces of the semiconductor fin within which a transistor channel is formed, are exposed in the opening. A replacement metal gate is formed by forming a diffusion barrier layer within the opening and over a gate dielectric material, the diffusion barrier layer formation advantageously followed by an in-situ plasma treatment operation. The treatment operation utilizes at least one of argon and hydrogen and cures surface defects in the diffusion barrier layer enabling the diffusion barrier layer to be formed to a lesser thickness. The treatment operation decreases resistivity, densifies and alters the atomic ratio of the diffusion barrier layer, and is followed by metal deposition.

17 Claims, 3 Drawing Sheets

REPLACEMENT GATE FINFET DEVICES AND METHODS FOR FORMING THE SAME

FIELD OF THE INVENTION

The present invention relates, most generally, to semiconductor devices and semiconductor device fabrication and, more particularly, to a method and structure used in fabricating metal gate transistors over semiconductor fin structures using replacement gate technologies, and the devices so formed.

BACKGROUND

Semiconductor fins are widely used in advanced semiconductor manufacturing technology because of the increased integration levels they provide. For example, when a transistor device such as a FinFET, fin Field Effect Transistor, is formed, it provides a gate width that may be larger, by an order of magnitude, than the gate width of a conventional transistor formed on the same substrate region over which the semiconductor fin is formed because the gate extends over the top and sides of the fins, all of which serve as channels. Semiconductor fins have high aspect ratios and require advanced and dedicated processing operations to forming working FinFET or other devices using the semiconductor fins.

When these devices are formed using advanced processing technology and miniaturized features of increasingly small dimensions, particular care must be taken in forming and positioning the features. In the semiconductor fabrication industry, transistors have typically been formed utilizing polysilicon gate electrodes. Polysilicon has been preferred because it is thermally robust and has other special and desirable characteristics. Polysilicon gates can withstand the processing of other elements of the transistors such as the source and drain regions, during dopant drive-in or other high temperature processes such as annealing processes. From a device standpoint, however, the use of polysilicon as the gate material is less advantageous than the use of metal as the gate material. A polysilicon gate is subject to the formation of a depletion region in operation in which charge carriers are depleted from the polysilicon material above the gate dielectric. A metal electrode provides the advantage that charge carriers are not depleted but remain plentiful throughout the gate electrode.

Metal gates are also much better conductors of electricity resulting in reduced gate contact resistance which provides faster device performance. The manufacture of metal gates, however, may pose serious challenges. For one, metal gates are not thermally robust like polysilicon and therefore cannot be exposed to high temperatures during processing of transistors or other elements of integrated circuits (ICs).

In recent years, there has been an effort to overcome the limitations of metal gate processing and the operational deficiencies of polysilicon gates through a process of forming transistor structures initially having polysilicon gates which are better able to withstand the more severe processing conditions of the immediately subsequent processing operations. Thereafter, in latter stages of processing when processing conditions are less severe, the polysilicon gates are removed from the structures and replaced with permanent metal gates. This replacement gate process, as it is known, also carries with it limitations that become an even greater concern as technologies advance, integration levels increase and feature sizes become smaller. This is especially true in the formation of FinFET devices and other transistors formed over semiconductor fins. For example, aluminum is a metal that is advantageously used as a metal gate material for a number of reasons including ease of processing using damascene planarization technology. To inhibit aluminum diffusion that adversely impacts device performance, however, a blocking layer must be used along with the aluminum metal gate material. This is also true for other suitable metals. The blocking layer must be compatible with the eWF (electrical Work Function) of the metal layer used and must be formed using a deposition process that will enable the film to be formed conformally within openings that may have high aspect ratios so that the metal layer can subsequently be deposited in the openings. According to conventional technologies, thermal atomic layer deposition, ALD, may be used to form the blocking layer. When thermal ALD is used to form very thin films, however, the films typically include pitting which is a defect that can adversely affect or even destroy device functionality.

An improved method is therefore needed that enables the formation of replacement metal gates and which addresses the above shortcomings conventionally associated with replacement metal gate formation processes.

SUMMARY OF THE INVENTION

To address these and other needs and in view of its purposes, one aspect of the invention provides a method of fabricating a gate structure of an integrated circuit. The method comprises providing a semiconductor fin over a substrate, defining a transistor channel along sides and on top of the semiconductor fin, and forming a sacrificial gate material over the channel along sides and on top of the semiconductor fin. The method further provides for depositing an interlevel dielectric over the substrate in a blanket deposition operation then planarizing the interlevel dielectric layer. The method further provides removing the sacrificial gate material thereby forming an opening in the interlevel dielectric material and exposing the transistor channel region, forming a high-k gate dielectric material on the transistor channel including along the sides and on the top of the semiconductor fin and depositing a diffusion barrier layer on the high-k gate dielectric and within the opening. The method further comprises treating the diffusion barrier layer in a plasma treatment operation using at least one of argon and hydrogen and then forming a metal gate material layer over the diffusion barrier layer and filling the opening.

According to another aspect, provided is a method of fabricating a gate structure of an integrated circuit, the method comprising forming a metal-containing gate in an opening within a dielectric region formerly occupied by a sacrificial gate, the method comprising forming a diffusion barrier layer within the opening and overlying a high-k gate dielectric material. The high-k gate dielectric material contacts a transistor channel region extending along sides and over top of a semiconductor fin. The method further comprises treating the diffusion barrier layer with a plasma including at least one of Ar and $H_2$ in a plasma treatment operation that is performed in-situ with forming the diffusion barrier layer and the method further comprises forming a metal gate material layer over the diffusion barrier layer and within the opening.

According to another aspect, provided is a method of fabricating a gate structure of an integrated circuit. The method comprises providing a semiconductor fin over a substrate. The method further provides for defining a transistor channel along sides and on top of the semiconductor fin and forming a sacrificial gate material over the channel along sides and on top of the semiconductor fin. An interlevel dielectric is then deposited over the substrate, then planarized such that a top of the interlevel dielectric layer is substantially co-planar with a top surface of the sacrificial gate material. The method further provides for removing the sacrificial gate material thereby forming an opening in the interlevel dielectric material and exposing the transistor channel, then forming a high-k gate dielectric material on the transistor channel including along the sides and on the top of the semiconductor fin. The method further comprises depositing a tantalum nitride barrier layer on the high-k gate dielectric and within the opening, treating the tantalum nitride barrier layer in a plasma treatment operation using at least one of argon and hydrogen, the plasma treatment operation performed in-situ with the deposition of the tantalum nitride barrier layer, and forming a metal layer over the diffusion barrier layer and filling the opening.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Provided is a method and structure for replacement gate technology as applied to semiconductor fin and other semiconductor devices. An aspect of the invention is the formation of a high integrity, pinhole-free diffusion barrier layer used in conjunction with a replacement metal gate, after removal of the sacrificial gate material.

Figure 1:
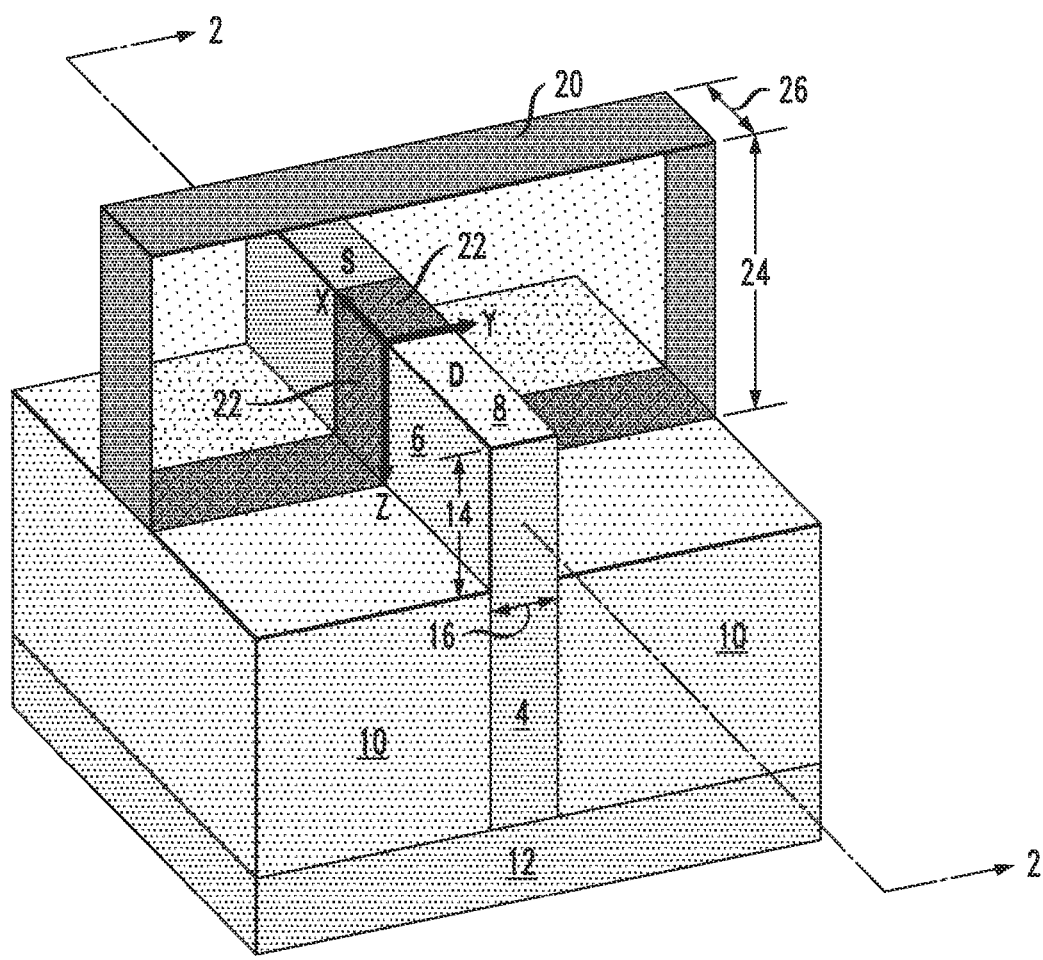
FIG. 1 is a perspective, three dimensional view in partial cross-section illustrating a sacrificial gate formed over a semiconductor fin.

FIG. 1 is a perspective, three dimensional view in partial cross-section illustrating a sacrificial gate formed over a semiconductor fin. Semiconductor fin 4 is formed over substrate 12 using known techniques. Semiconductor fin 4 may be formed of silicon, silicon-germanium, germanium or other suitable semiconductor materials. Semiconductor fin 4 includes opposed sides 6 and top 8 and is disposed between STI (shallow trench isolation) structures 10. Semiconductor fin 4 includes width 16 which may vary from about 15 nm to about 50 nm in various exemplary embodiments and may advantageously be about 22-26 nm. Height 14 may range from about 20-40 nm in various exemplary embodiments and the overall height of semiconductor fin 4, i.e., the distance between top 8 and the interface between semiconductor fin 4 and substrate 12, may be about 60-90 nm but various other dimensions may be used in other exemplary embodiments. Various suitable substrates may be used as substrate 12.

Transistor channel 22 is defined along top 8 and sides 6 of semiconductor fin 4 and extends between the source S and drain D regions. A transistor such as a FinFET transistor may be formed along semiconductor fin 4 utilizing transistor channel 22. Sacrificial gate 20 is illustrated in FIG. 1 and may be formed of polysilicon or other non-metal materials that are durable and thermally robust but easily removable. Any of various known methods for forming the structure shown in FIG. 1, may be used. Sacrificial gate 20 includes width 26 and height 24, with width 26 substantially serving as the channel length for transistor channel 22. According to various exemplary embodiments, height 24 may range from about 75-120 nm and may be about 90 nm in one advantageous embodiment and width 26 may be about 22 nm in one exemplary embodiment, but may alternatively range from about 15 nm to about 50 nm in other exemplary embodiments. Sacrificial gate 20 extends along sides 6 and top 8 of semiconductor fin 4 and also extends laterally past opposed sides 6. Although not visible in FIG. 1, a hard mask may advantageously be formed under sacrificial gate 20 and on the surfaces of sides 6 and top 8 that form transistor channel 22, i.e., at the interface between sacrificial gate 20 and semiconductor fin 4 (see FIG. 2).

Figure 2:
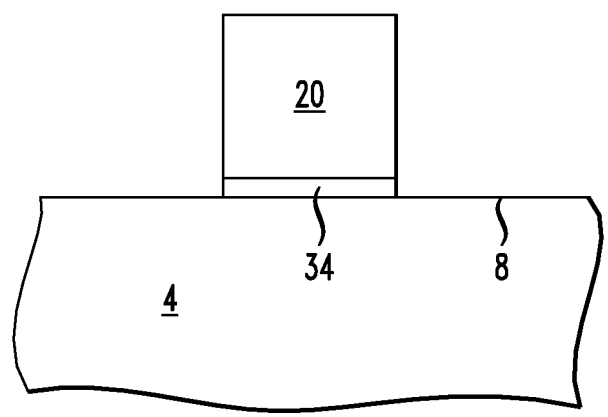
FIG. 2 is a cross-sectional view of a sacrificial gate structure taken along line 2-2 of FIG. 1.

FIG. 2 is a cross-sectional view taken along line 2-2 of FIG. 1 and illustrates only upper portions of the structure shown in FIG. 1. FIG. 2 shows sacrificial gate 20 disposed over top 8 of semiconductor fin 4. FIG. 2 also illustrates optional hard mask 34 which will have been formed prior to the formation of sacrificial gate 20, using conventional methods. In other exemplary embodiments, hard mask 34 may not be used. Although sacrificial gate 20 is only illustrated to be over top 8 of semiconductor fin 4 in FIG. 2 due to the cross-section being taken as indicated with respect to FIG. 1, it should be understood that sacrificial gate 20 extends in and out of the plane of the drawing figure and along and past respective opposed sides 6 as can be seen in FIG. 1.

Figure 3:
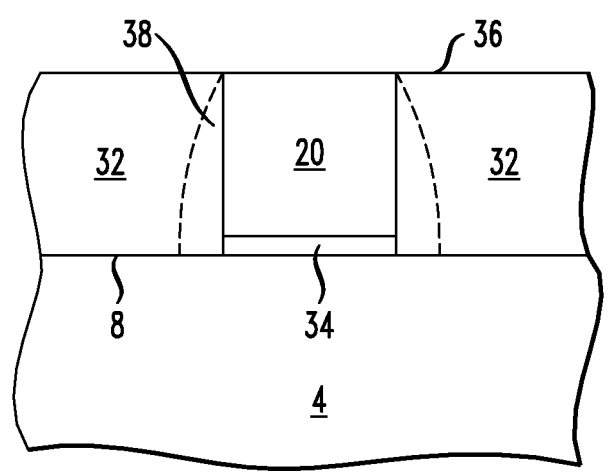
FIGS. 3-5 are cross-sectional views showing subsequent processing operations performed on the structure shown in FIG. 2, to form a replacement metal gate according to the invention.

A blanket or other deposition operation may then be used to form a dielectric over the structure shown in FIG. 2 and this deposition process may be followed by a planarization process to produce the structure shown in FIG. 3. Interlevel dielectric 32 may be any of various suitable dielectrics used as ILD's, interlevel dielectrics or ND's, inter-metal dielectrics, suitably known in the semiconductor arts. Prior to the deposition of interlevel dielectric 32, optional spacers may be formed and optional spacers 38 are indicated by dash lines. Conventional methods and materials may be used in the formation of optional spacers 38. After planarization, top surface 36 is a generally planar surface and includes co-planar upper surfaces of interlevel dielectric 32 and sacrificial gate 20.

Figure 4:
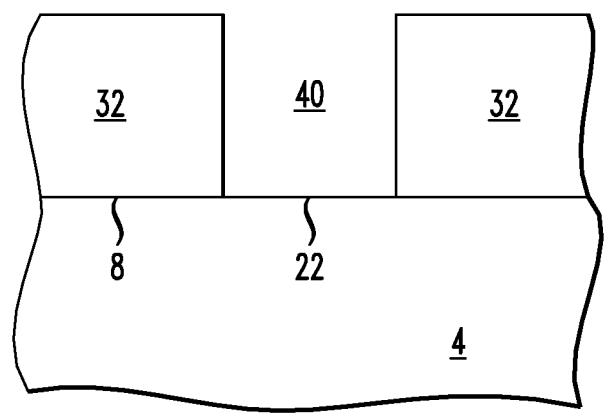

FIG. 4 shows the structure of FIG. 3 without optional spacers 38, after a removal operation has been used to sequentially remove sacrificial gate 20 then hardmask 34 thereby forming opening 40 within interlevel dielectric 32. Various processes may be used to selectively remove sacrificial gate 20 then hardmask 34 to form opening 40 without attacking the underlying transistor channel 22. In various exemplary embodiments, wet chemical etching operations may be used, RIE (reactive ion etching) operations may be used, or various other suitable etching operations may be used. After sacrificial gate 20 is removed, stopping at hard mask 34 to avoid damaging the surfaces of transistor channel 22 of semiconductor fin 4, hard mask 34 is then removed to expose the transistor channel 22 surface portion of top 8 of semiconductor fin 4, as illustrated in FIG. 4, and also the portions of transistor channel 22 along sides 6 of semiconductor fin 4. Opening 40 within interlevel dielectric 32 and which was formerly occupied by sacrificial gate 20, is bounded on its sides by interlevel dielectric 32 and subjacently by the surfaces of semiconductor fin 4 that form transistor channel 22.

Figure 5:
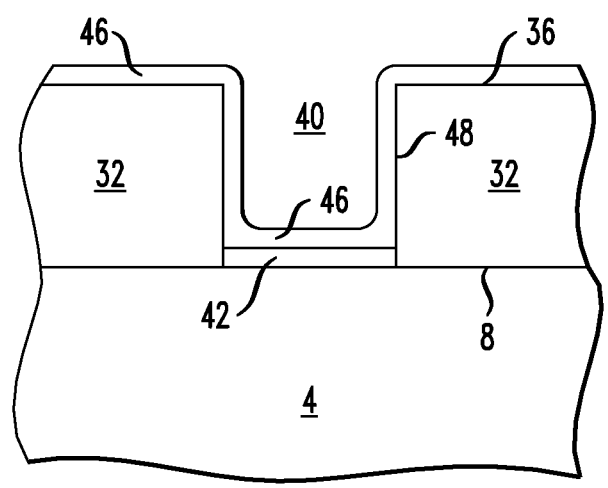

Now turning to FIG. 5, gate dielectric 42 is formed on the surfaces of semiconductor fin 4 that form transistor channel 22. Gate dielectric 42 may be an oxide layer, an oxynitride layer or a high-k gate dielectric material and it may be thermally grown on the exposed semiconductor fin 4 surfaces within opening 40 or it may be formed by deposition, such as by low pressure chemical vapor deposition, LPCVD or other suitable methods. Various suitable materials may be used for gate dielectric 42, such as hafnium oxide, $HfO_2$, zirconium oxide, $ZrO_2$ or other suitable gate dielectric materials that have a desirably high dielectric constant k, i.e. higher than that of silicon dioxide. Various suitable thicknesses may be used and will be chosen in conjunction with device speed and application.

After the formation of gate dielectric 42, diffusion barrier layer 46 is conformally formed over surface 36 and within opening 40 including on gate dielectric 42 and along sidewalls 48. Various methods may be used to form diffusion barrier layer 46 and according to one advantageous embodiment, thermal atomic layer deposition, ALD, may be used but other deposition methods may be used in other exemplary embodiments. Diffusion barrier layer 46 inhibits diffusion of the aluminum or other metal that will later be formed to fill opening 40 and to provide a replacement metal gate. Thermal ALD provides a substantially conformal deposition process and the material used as diffusion barrier layer 46 is chosen to include an electrical work function, eWF, that is compatible with the conductive material that will be formed in opening 40 to serve as the metal gate. Diffusion barrier layer 46 is also chosen in conjunction with the conductive material to provide the desired long channel $V_t$'s. According to one exemplary embodiment, tantalum nitride, TaN may be used and may be formed to a thickness ranging from 20 angstroms to 40 angstroms but other thicknesses may be used in other exemplary embodiments. In other exemplary embodiments, diffusion barrier layer 46 may consist of or include one or more materials such as titanium nitride, hafnium nitride and zirconium nitride.

According to an aspect of the invention, an $H_2$/Ar treatment step may be performed upon diffusion barrier layer 46 and may be carried out in-situ with the ALD formation of diffusion barrier layer 46. The treatment operation may be a plasma operation and may use hydrogen, $H_2$, argon, Ar, or both species. The treatment can be carried out using $H_2$ only, Ar only or both of $H_2$ and Ar. Plasma treatment conditions may include a pressure that ranges from about 0.3 to 10 torr, a power that ranges from about 300-2500 watts and the treatment time may range from about 5-100 seconds. Argon flow may range from about 100-1500 sccm and hydrogen flow may also range from about 100-1500 sccm according to embodiments in which only one of the aforementioned gases is used and also according to embodiments in which both gases are used. According to embodiments in which both gases are used, various ratios of the two gases may be used. According to other exemplary embodiments, other inert gases may be used for the plasma treatment operation that is advantageously carried out in-situ with the deposition operation that is used to form diffusion barrier layer 46.

The treatment operation improves the film morphology of the diffusion barrier layer, especially when carried out in-situ and renders a smooth, substantially pinhole-free diffusion barrier layer. As such, when the novel treatment operation is used, it enables the diffusion barrier layer to be advantageously formed to a lesser thickness. In one exemplary embodiment, the thickness of diffusion barrier layer 46 may be about 30 angstroms or less, but other thicknesses may be used in other exemplary embodiments. The treatment operation densifies diffusion barrier layer 46 and also lowers resistivity of diffusion barrier layer 46. According to one exemplary embodiment in which the diffusion barrier layer 46 was formed of tantalum nitride, the treatment operation lowered the resistivity by two orders of magnitude. The treatment operation also increases the relative atomic amount of tantalum in the tantalum nitride film. According to one exemplary trial, the Ta:N ratio changed from 0.49 to 0.76 indicating a higher Ta concentration and a lower N concentration, after the treatment operation. This is exemplary only and other relative increases and other stoichiometric changes may be achieved in other exemplary embodiments. The reduced film thicknesses that may be used for diffusion barrier layer 46 due to the subsequent plasma treatment operation, maximize the width of opening 40 making it easier to subsequently fill the opening with a conductive material.

After the structure in FIG. 5 is formed, subsequent operations may be used to form a conductive material within and filling opening 40. According to one exemplary embodiment, the conductive material may be aluminum, but other conductive materials may be used in other exemplary embodiments. According to one exemplary embodiment, the conductive material may be formed using at least one chemical vapor deposition operation and at least one physical vapor deposition operation but in other exemplary embodiments, only one of the aforementioned operations may be used and in other exemplary embodiments, still other deposition operations may be used. Conventional processing may then be utilized to carry out further processing steps which may include a CMP, chemical mechanical planarization, or other planarization process to form a metal gate that includes the conductive material and diffusion barrier layer 46 filling former opening 40 which was previously occupied by a sacrificial gate material. Further processing operations may then be carried out to effectuate the manufacture of suitable semiconductor devices.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of fabricating a gate structure of an integrated circuit, said method comprising:
    forming a metal-containing gate in an opening within a dielectric region formerly occupied by a sacrificial gate, said forming a metal-containing gate comprising:
    forming a diffusion barrier layer within said opening and overlying a high-k gate dielectric material, said high-k gate dielectric material contacting a transistor channel region extending along sides and over top of a semiconductor fin disposed directly between opposed shallow trench isolation (STI) structures;
    treating said diffusion barrier layer with a plasma including at least one of Ar and $H_2$ in a plasma treatment operation that is performed in-situ with said forming a diffusion barrier layer; and
    forming a metal gate material layer over said diffusion barrier layer and within said opening.

2. The method as in claim 1, wherein said metal gate material layer comprises aluminum and said forming a metal gate material layer comprises said metal gate material layer filling said opening.

3. The method as in claim 1, wherein said forming a metal gate material layer includes at least one chemical vapor deposition operation and at least one physical vapor deposition operation.

4. The method as in claim 1, wherein said diffusion barrier layer comprises zirconium nitride.

5. The method as in claim 1, wherein said diffusion barrier layer comprises hafnium nitride and said treating said diffusion barrier layer with a plasma reduces resistivity of said diffusion barrier layer.

6. The method as in claim 1, wherein said treating said diffusion barrier layer with a plasma comprises a pressure within a range of about 0.3 to 10 torr and a power within a range of about 300-2500 watts.

7. The method as in claim 1, wherein said treating said diffusion barrier layer with a plasma comprises both Ar and $H_2$, each at a flow rate within a range of about 100-1500 sccm.

8. The method as in claim 1, wherein said forming a diffusion barrier layer comprises atomic layer deposition.

9. A method of fabricating a gate structure of an integrated circuit, said method comprising:
    providing a semiconductor fin over a substrate;
    defining a transistor channel along sides and on top of said semiconductor fin;
    forming a hardmask on said sides and said top of said semiconductor fin;
    forming a sacrificial gate material over said hardmask over said transistor channel;
    depositing an interlevel dielectric over said substrate in a blanket deposition operation then planarizing said interlevel dielectric layer to form an upper planar surface including coplanar top surfaces of said sacrificial gate material and said interlevel dielectric layer;
    removing said sacrificial gate material, then said hardmask, thereby forming an opening in said interlevel dielectric material and exposing said transistor channel;
    forming a high-k gate dielectric material on said transistor channel including along said sides and on said top of said semiconductor fin;
    depositing a diffusion barrier layer on said high-k gate dielectric and within said opening;
    treating said diffusion barrier layer in a plasma treatment operation using at least one of argon and hydrogen; and
    forming a metal gate material layer over said diffusion barrier layer and filling said opening.

10. The method as in claim 9, wherein said diffusion barrier layer comprises tantalum nitride.

11. The method as in claim 10, wherein said treating said diffusion barrier layer increases a ratio of atomic percentage of Ta:N in said tantalum nitride.

12. The method as in claim 9, wherein said treating said barrier layer is performed in-situ with said depositing a diffusion barrier layer.

13. The method as in claim 9, wherein said depositing a diffusion barrier layer comprises thermal atomic layer deposition and said treating said diffusion barrier layer decreases resistivity of said diffusion barrier layer.

14. The method as in claim 9, further comprising forming spacers along sides of said sacrificial gate material prior to said depositing an interlevel dielectric.

15. The method as in claim 9, wherein said diffusion barrier layer comprises tantalum nitride and said treating said diffusion barrier layer is performed in-situ with said depositing a diffusion barrier layer.

16. The method as in claim 9, wherein said metal gate material layer comprises aluminum and said forming a metal gate material layer includes at least one chemical vapor deposition operation and at least one physical vapor deposition operation.

17. A method of fabricating a gate structure of an integrated circuit, said method comprising:
    providing a semiconductor fin over a substrate and disposed directly between and adjacent opposed shallow trench isolation (STI) structures;
    defining a transistor channel along sides and on top of said semiconductor fin;
    forming a sacrificial gate material over a hardmask formed on said transistor channel including along said sides and said top of said semiconductor fin;
    depositing an interlevel dielectric over said substrate then planarizing said interlevel dielectric layer such that a top surface of said interlevel dielectric layer is substantially co-planar with a top surface of said sacrificial gate material;
    removing said sacrificial gate material, then said hardmask, thereby forming an opening in said interlevel dielectric material and exposing surfaces of said semiconductor fin that comprise said transistor channel;
    forming a high-k gate dielectric material on said transistor channel including along said sides and on said top of said semiconductor fin;
    depositing a zirconium nitride barrier layer on said high-k gate dielectric and within said opening;
    treating said zirconium nitride barrier layer in a plasma treatment operation using at least one of argon and hydrogen, said plasma treatment operation performed in-situ with said depositing a zirconium nitride barrier layer; and
    forming a metal layer over said diffusion barrier layer and filling said opening.

* * * * *